United States Patent [19]

Crockett, Jr. et al.

[11] Patent Number: 5,615,387
[45] Date of Patent: Mar. 25, 1997

[54] METHOD AND APPARATUS FOR REWORKING PRINTED CIRCUIT BOARDS USING SURFACE COATING AND SELECTIVE REMOVAL OF AN ELECTRICALLY CONDUCTIVE MATERIAL

[75] Inventors: Charles H. Crockett, Jr.; Steven A. Duncan, both of Austin; Stephen A. Dunn, Georgetown; David W. Malone; Michael G. McMaster, both of Austin, all of Tex.

[73] Assignee: International Business Machines Corporation, Armonk, N.Y.

[21] Appl. No.: 589,795

[22] Filed: Jan. 22, 1996

Related U.S. Application Data

[63] Continuation of Ser. No. 369,563, Jan. 6, 1995, abandoned, which is a continuation of Ser. No. 968,909, Oct. 30, 1992, abandoned.

[51] Int. Cl.$^6$ ........................................................ H05K 3/00
[52] U.S. Cl. .................. 395/800; 29/402.01; 29/402.06; 29/402.07; 29/402.08; 29/829; 29/846; 427/140; 427/96; 174/260; 364/929.4; 364/929.5; 364/929.71
[58] Field of Search .............................. 395/800; 29/829, 29/846, 402.06, 402.08, 402.07, 402.01; 427/140, 96; 174/260; 364/929.4, 929.5, 929.71

[56] References Cited

U.S. PATENT DOCUMENTS

| | | | |
|---|---|---|---|
| 3,934,335 | 1/1976 | Nelson | 29/847 |
| 4,354,895 | 10/1982 | Ellis | 156/631 |
| 4,438,561 | 3/1984 | Mueller | 29/831 |
| 4,540,464 | 9/1985 | Mueller et al. | 156/639 |
| 4,654,102 | 3/1987 | Wery et al. | 156/250 |
| 4,683,652 | 8/1987 | Hatfield | 29/829 |
| 4,731,704 | 3/1988 | Lochner | 361/400 |
| 4,742,431 | 5/1988 | Igarashi | 361/398 |
| 4,752,553 | 6/1988 | Sullivan | 430/271 |
| 4,915,983 | 4/1990 | Lake et al. | 427/98 |
| 5,077,891 | 1/1992 | Lychyk et al. | 29/829 |
| 5,214,250 | 5/1993 | Cayson et al. | 174/250 |

OTHER PUBLICATIONS

Research Disclosure, "Surface Mounted Technology Card Rework with Flexible Applique", Mar. 1992, No. 335, Kenneth Mason Publications Ltd., England.
IBM Technical Disclosure Bulletin, "Multi-Leaded Surface--Mounted Component Extender Device", vol. 30, No. 5, Oct. 1987, pp. 35–36.
IBM Technical Disclosure Bulletin, "Engineering Change Method and Hardware", vol. 29, No. 7, Dec. 1986, p. 2953.
IBM TDB, "Re-Laminating External Copper Foils", vol. 23, No. 3, Aug. 1980, p. 980.
IBM TDB, "Reworking of Component Bearing Cards", vol. 20, No. 4, Sep. 1977, pp. 1532–1533.
IBM TDB, "Making Wiring Changes", vol. 6, No. 10, Mar. 1964, pp. 83–84.
IBM TDB, "Overlay for Wiring Changes", vol. 10, No. 7, Dec. 1967, p. 895.
IBM TDB, "Printed-Circuit Card Rework Process", vol. 15, No. 1, Jun. 197, pp. 246–247.
IBM TDB, "Circuit Overlay Adapter Assembly for Circuit Changes", vol. 18, No. 7, Dec. 1975, pp. 2050–2051.

*Primary Examiner*—Alyssa H. Bowler
*Assistant Examiner*—Dzung C. Nguyen
*Attorney, Agent, or Firm*—Paul S. Drake; Volel Emile

[57] ABSTRACT

A method of reworking a printed circuit board having a surface including areas needing to be reworked including the steps of covering the surface with a dielectric leaving uncovered at least the areas of the surface to be reworked, and selectively providing corrective circuitry on the dielectric interconnected to the uncovered areas of the surface needing to be reworked. In addition, a printed circuit board having a surface including reworked areas including a dielectric covering the surface leaving uncovered at least the reworked areas, and corrective circuitry on the dielectric interconnected to the uncovered reworked areas.

20 Claims, 5 Drawing Sheets

METHOD AND APPARATUS FOR REWORKING PRINTED CIRCUIT BOARDS USING SURFACE COATING AND SELECTIVE REMOVAL OF AN ELECTRICALLY CONDUCTIVE MATERIAL

This is a continuation of application Ser. No. 08/369,563 filed Jan. 6, 1995 now abandoned, which is a continuation of application Ser. No. 07/968,909 filed Oct. 30, 1992, now abandoned.

TECHNICAL FIELD

The present invention related to reworking a printed circuit board.

BACKGROUND ART

Manufactured printed circuit boards (PCBs) often contain design or manufacturing errors. These printed circuit boards may be scrapped or they may be reworked to correct these errors.

One of the most known methods for reworking printed circuit boards is to solder yellow wire jumper cables, also referred to as discrete wires, between surface points on the printed circuit board to interconnect those points. In addition, improper internal and surface connections in the printed circuit board may be broken by drilling holes through the board severing those connections. This is a process normally done by hand and is time consuming, expensive and error prone. For example, a person reworking the circuit board may solder the yellow wire to an incorrect location on the printed circuit board or may damage the printed circuit during the soldering process. However, this method of reworking continues to be one of the most prevalent methods used today.

A method taught in *IBM Technical Disclosure Bulletin* entitled "Engineering Change Method and Hardware" (Vol. 29, No. 7, p. 2953, Dec. 1986) utilizes gluing a smaller auxiliary printed circuit board onto the original printed circuit board and connecting the auxiliary printed circuit board to the original printed circuit board with yellow wire jumper cables. This allows the user the capability of providing additional wiring and/or devices on the auxiliary printed circuit board. However, this process utilizes a large area of surface real estate on the original printed circuit board and the soldering process is error prone as described above.

Another technique is described in U.S. Pat. No. 4,742,431 and *IBM Research Disclosure* entitled "Surface Mounted Technology Card Rework with Flexible Applique" (No. 335, Mar. 1992) wherein a flexible auxiliary wiring board is attached to the printed circuit board similar to the auxiliary printed circuit board described above. This technique allows the user to provide additional wiring and/or devices on the auxiliary wiring board. However, the thinner material used in the auxiliary wiring board allows for soldering the wiring from the auxiliary board directly to the underlying printed circuit board or to devices located on the underlying printed circuit board.

A recent technique for adding selected circuit lines to the surface of a printed circuit board involves screen printing a thin conducting polymer line across the surface of a printed circuit board contacting preexisting circuit points at either end of the polymer line. This technique also provides the capability of adding additional bonding pads.

In EPO 126171 and *IBM Technical Disclosure Bulletin* entitled "Printed-Circuit Card Rework Process" (Vol. 15, No. 1, pp. 246–247, June 1972), in a technique called subtractive etch, the outside circuit layer of the printed circuit board may be completely reworked. The outside circuit layer is completely milled or etched off. An auxiliary circuit layer is then laminated or deposited onto the etched printed circuit board. One of the primary disadvantages of this technique is that the subtractive etch process is difficult to control and may excessively mill or etch back into other underlying circuitry.

DISCLOSURE OF THE INVENTION

The present invention includes a method of reworking a printed circuit board having a surface including areas needing to be reworked including the steps of covering the surface with a dielectric leaving uncovered at least the areas of the surface to be reworked, and selectively providing corrective circuitry on the dielectric interconnected to the uncovered areas of the surface needing to be reworked. In addition, the present invention includes a printed circuit board having a surface including reworked areas including a dielectric covering the surface leaving uncovered at least the reworked areas, and corrective circuitry on the dielectric interconnected to the uncovered reworked areas.

A further understanding of the nature and advantages of the present invention may be realized by reference to the remaining portions of the specification and the drawings.

BEST MODE FOR CARRYING OUT THE INVENTION

Figure 1:
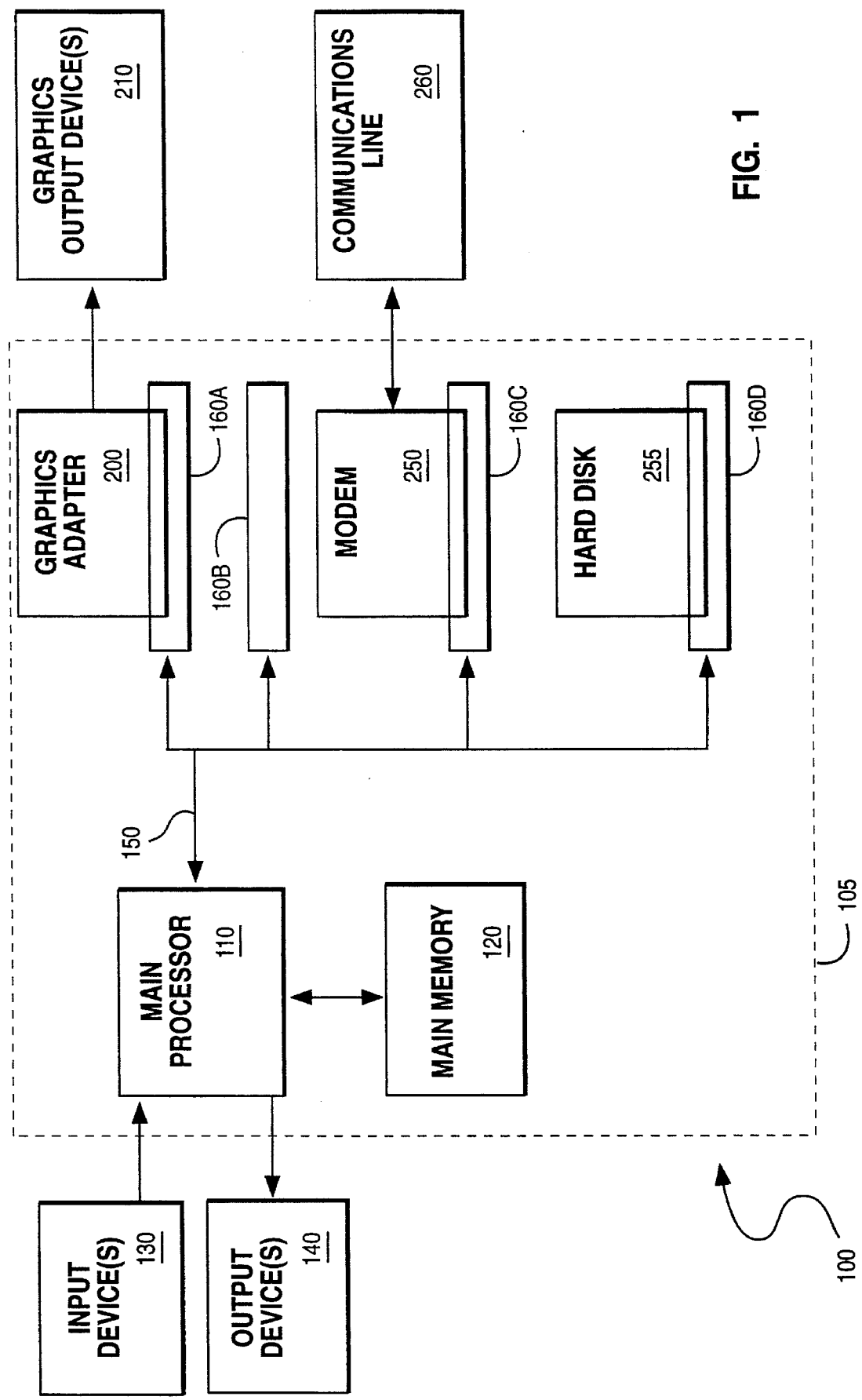
FIG. 1 is a block diagram of a typical digital computer utilizing printed circuit boards that may be reworked according to a preferred embodiment of the invention.

The present invention may be utilized on printed circuit boards that are utilized in a variety of electronic equipment. This includes but is not limited to digital computers. FIG. 1 is a block diagram of a typical digital computer 100 utilizing printed circuit boards that may be reworked according to a preferred embodiment of the invention. The computer includes a computer box 105 which encloses a printed circuit board that includes a main processor or central processing unit (CPU) 110 coupled to a memory 120. The main processor may communicate with input device(s) 130 and output device(s) 140 located outside the computer box 105. Main processor 110 may include a single processor or multiple processors. Memory 120 may generally be expanded in amount by adding more memory cards or printed circuit boards. Input device(s) 130 may include a keyboard, mouse, tablet or other types of input devices. Output device(s) 140 may include a text monitor, plotter or other types of output devices. The input and output devices may also contain circuitry on printed circuit boards.

The main processor may also be coupled within computer box 105 to multiple input/output (I/O) slots 160A, 160B, 160C and 160D via bus 150. Bus 150 may be a standard bus such as the Micro Channel (trademark of International Business Machines Corporation). More or fewer I/O slots may be provided depending upon the computer system. The multiple I/O slots provide the capability to insert various option cards or printed circuit boards containing circuitry into the computer system which would then communicate with the main processor via bus 150.

An example of an option card including a printed circuit board inserted into the I/O slots would be a graphics adapter 200 which would be attached to a graphics output device such as a graphics display or plotter 210. Graphics adapter 200 would then receive instructions regarding graphics from main processor 110 on bus 150. The graphics adapter then executes those instructions and provides the results to the graphics output device 210 thereby rendering the desired graphics output from the main processor.

Another example of an option card including a printed circuit board inserted into an I/O slot would be a modem 250 which would then be attached to a communications line 260 such as a telephone line. Modem 250 would then receive instructions from main processor 110 to initiate communications over the communication lines 260 to a similarly configured computer system. The modem would then establish the desired communications link and provide communication from the main processor to the other computer system as well as provide communication from the other system to the main processor. Modem 250 may also receive requests from other computer systems over communications line 260 to initiate communications with main processor 110.

Many other types of option cards including printed circuit boards may be utilized in the I/O slots 160A–160D such as hard disk 255 or memory cards. Hard disk 255 represents a hard disk adapter plugged into the I/O slot in combination with a hard disk drive located next to the adapter. In general, any of the option cards may be inserted into any of the available I/O slots. In addition, some option cards may be hotter than others and greater cooling may be needed for that area of the computer system. Cooling is generally required for all electronic devices included in the computer box 105.

The present invention may be used to rework printed circuit boards (PCB's) manufactured according to many types of manufacturing techniques. Two types of printed circuit board manufacturing techniques will be described below to illustrate the capabilities of the present invention to modify many types of printed circuit boards.

A first manufacturing technique of printed circuit boards is called a laminate process. A base core is first manufactured by pressing two sheets of copper foil together with an insulating epoxy glass mesh between the sheets to insulate the copper foil sheets from each other and to provide adhesion. At least one of the copper foil sheets is then etched to provide personalized circuitry. Multiple etched base cores are then laminated together into a finished laminate with insulating epoxy glass mesh between each of the base cores to provide insulation and adhesion. However, the outside copper foil layer of the outside base cores have usually not been etched. Many holes are then drilled through the finished laminate at selected locations. The holes will be used for providing interconnect vies between the various copper layers. A smear remove is then used to clean the drilled laminate. Copper is then electrolytically plated onto the laminate to provide conductivity in the drill holes and to plate the outer surfaces. A subtractive etch process is then used to remove unwanted copper from the surfaces. The remaining copper is in the vies and at selected locations as traces and bonding pads. When the printed circuit board is used at a later stage for assembling devices to the board, pin in hole devices may then be soldered into the vias and surface mount devices may then be soldered to the bonding pads. Prior to the device assembly process, a protective photosensitive dielectric is then placed on the outer surfaces of the laminate. This photosensitive dielectric, often referred to as soldermask, and may be Probimer 52 from Ciba-Geigy or one of many other chemicals used in the industry with the desired dielectric or photosensitive characteristics. The soldermask is then exposed by a collimated light source through a mask to polymerize the exposed areas. The exposed laminate is then developed to remove all the unexposed soldermask. This removal of unexposed soldermask provides for access to the bonding pads and the vias through the board. The resulting soldermask is then dried and cured, usually thermally. An epoxy ink is then used to print information such as a description of the devices to be placed on the printed circuit board surface. In a final step, a corrosion inhibiter such as Entek (copper triazole) by Enthone is then thinly sprayed over the outside surface of the printed circuit board. The printed circuit board is then ready for trimming of the outside edges which were used for handling of the board and for assembly of the board with devices and soldering of those devices to the printed circuit board.

Another more recent technique known for manufacturing a printed circuit board is known as surface laminer circuitry. In this process, a base core of copper foil sheets surrounding an insulating epoxy glass mesh layer is etched to provide a personalized circuit on at least one of the copper surfaces. A photosensitive dielectric such as Probimer 52 is then coated over the etched copper. The photosensitive dielectric is then exposed and developed to remove the unexposed dielectric. The unexposed areas are often used to provide vias to the underlying copper circuitry. The exposed dielectric surface is then roughened to provide a capability of adhering copper to that surface. This roughening may be done by a combination of a mechanical scrub of the surface with a pumice paste and a swelling of the surface with a solvent. Another layer of copper is then electrolytically plated onto the roughened exposed dielectric and into the vias to the underlying circuit layers. That copper layer is then etched to provide a second layer of circuitry and vias to the lower layer. This process of adding photosensitive dielectric and copper may be repeated several times to provide multiple layers of circuitry. The printed circuit board may then be drilled to provide additional vias to underlying circuitry. Again, the surface is roughened and copper plated to provide conductive vias in the drilled holes and to plate the outer surfaces. A subtractive etch process is then used to remove unwanted copper from the surfaces. The remaining copper is in the vias and at selected locations as traces and bonding pads. As described above, a protective photosensitive dielectric is then placed on the outer surfaces of the laminate, exposed, and developed to provide access to the bonding pads and the vias through the board. The resulting board is then dried and cured, usually thermally. An epoxy ink is then used to print information such as a description of the devices to be placed on the printed circuit board. A corrosion inhibiter such as Entek is then thinly spread over the outside surface of the printed circuit board.

The present invention is directed to reworking a completed printed circuit board prior to installation of devices such as transistors, resistors or integrated circuits. However, prior to reworking the printed circuit board, the board may have been substantially handled and stored for long periods of time in a dirty environment. As a result of the manufacturing techniques described above and the subsequent handling and storage of the printed circuit board, the board is typically in poor condition for reworking. For example, variable rack sizes are needed to handle the potentially nonstandard sizes of the printed circuit boards to be reworked. Printed circuit boards come in many sizes and may have already been trimmed of their outer edges which normally include tooling holes for handling the printed circuit boards during manufacturing.

Figure 2:
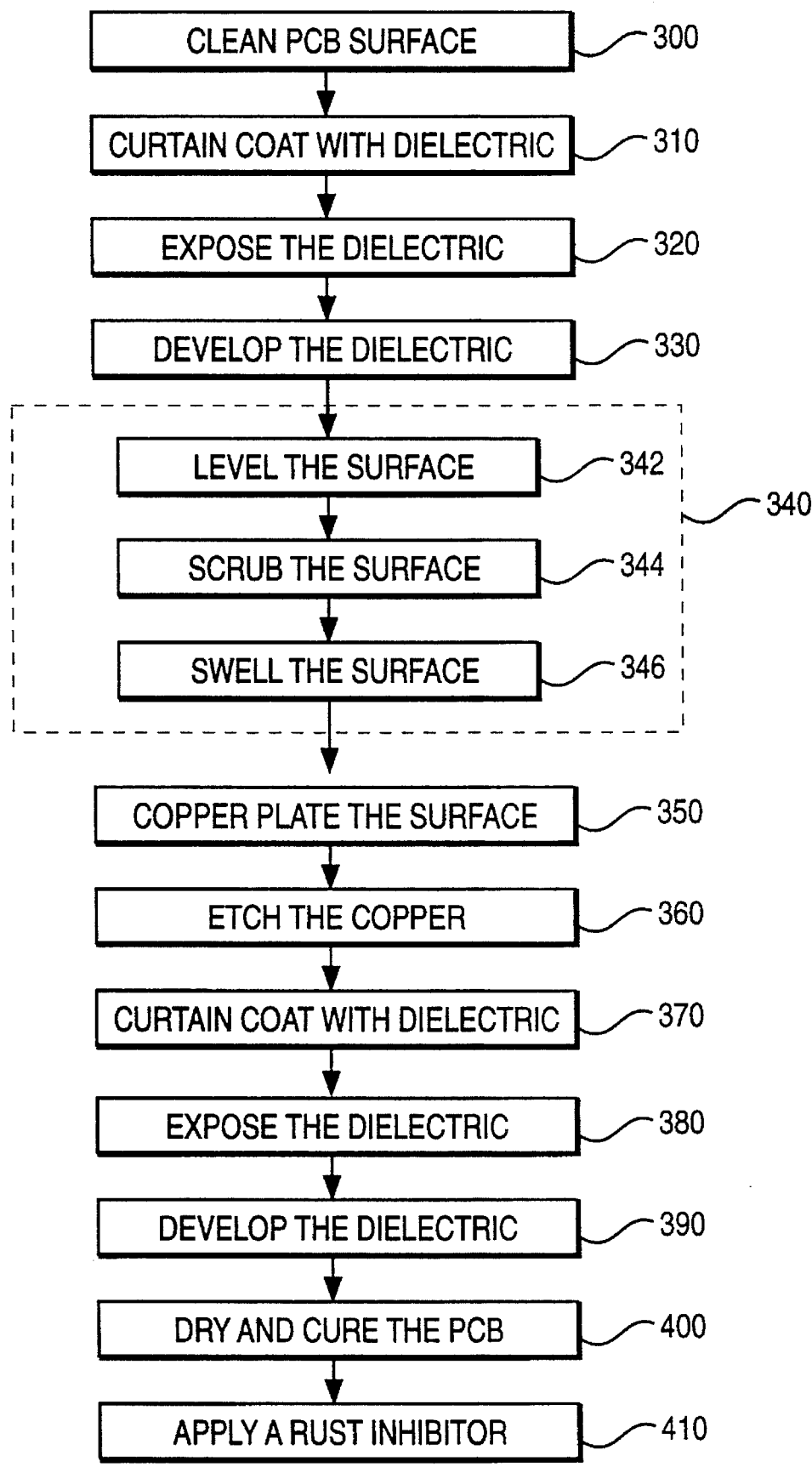
FIG. 2 is a flowchart illustrating the process for reworking the printed circuit board according to a preferred embodiment of the invention.

FIG. 2 is a flowchart illustrating the process for reworking the printed circuit board according to a preferred embodiment of the invention. For simplicity of description, the process will be described with reference to reworking a single side of the printed circuit board that has copper wiring. However, one of ordinary skill in the art could easily apply the below described process to both surfaces of a printed circuit board or to other types of printed circuit boards. In a first step 300, a hoist machine dips the printed circuit board in a series of chemical baths to clean the exterior surface. In the preferred embodiment, the printed circuit board is first dipped in a sodium hydroxide bath that cleans and degreases the board. The printed circuit board is then dipped in a sulfuric acid/sodium persulfate bath to remove existing copper oxides. The printed circuit board is then dipped in a bath of sodium chlorite, in a process step called black oxide. The chlorite process slightly oxidizes the copper on the surface of the printed circuit board to enhance adhesion of various substances to the copper as will be described below. In a second step 310, a curtain coater is used to coat the outside surface of the printed circuit board with at least one layer of a photosensitive dielectric. The photosensitive dielectric is preferably fully polymerizing with the desired dielectric characteristics. When exposed to light, fully polymerizing dielectrics such as Probimer 61 from Ciba-Geigy and ASM (Advanced SolderMask) from IBM polymerize vertically throughout the dielectric rather than just on the surface. As a result, the dielectric is more controllable vertically, such that sidewalls are more consistently defined. This controllability is particularly advantageous in the present invention due to the preexisting vias and other features that cause board noncoplanarities. In addition, roughening of the dielectric surface as described below in step 340 would also cause inconsistent sidewall definition if the dielectric were not fully polymerizing. However, in an alternative embodiment, partially polymerizing dielectric, such as Probimer 52 from Ciba-Geigy, may be used. In this alternative embodiment, after the dielectric has been developed it may be heavily exposed to a light source to polymerize the via sidewalls thereby providing the desired sidewall definition. The number of layers of dielectric used primarily depends on the desired level of insulation over the underlying circuitry. In a third step 320, the photosensitive dielectric is then exposed by a collimated light source through a predefined mask. The light source must be properly aligned with the underlying circuitry prior to exposure of the dielectric to the light source. However, this may be difficult if the tooling holes or fiducials (copper circles located on the outside edge of the printed circuit board that is trimmed off after manufacturing) are missing. If so, then the board may need to be hand positioned, otherwise, optical alignment tools may be utilized. In a fourth step 330, an appropriate developer such as GBL (gamma-butyrolactone or 4-hydoxybutyric acid gamma-lactone) is then used to develop the unexposed dielectric from the surface of the printed circuit board.

As a result of the above process steps, the exposed surface of the printed circuit board includes polymerized dielectric just deposited and several exposed elements from the original printed circuit board surface. The exposed original surface elements include cured dielectric, epoxy ink, oxidized copper, and any residue still remaining on the original surface. This presents a problem of adhering copper across all these different types of surface elements. As a result, in step 340, the surface of the board is toughened to provide for adhesion. In step 342, a surface grinder is used to level the surface to an even desired thickness and roughness. In step 344, a pumice slurry scrubber then roughens the surface and cleans out the vias that were clogged during the leveling process. As a result, the surface is mechanically leveled, toughened and cleaned. Subsequently, in step 346, a chemical bath is used to swell the surface of the board with a solvent such as sodium hydroxide/ethylene glycol and is preferably further etched with a solution of sodium permanganate. As a result, the surface is further cleaned and is microscopically further roughened. The solvent is preferably one that works on exposed and developed but uncured dielectric, cured dielectric, and epoxy inks.

In step 350, a copper layer is formed onto the outside surface of the board. There are several methods for performing this process as known by those of ordinary skill in the art. In the present invention, the preferred method is to first sequentially dip the printed circuit board in a series of chemical baths which will clean, seed, activate, and electrolessly plate copper on the surface of the printed circuit board. The printed circuit board is then baked for adhesion enhancement. Subsequently, the printed circuit board is electrolytically plated in a pyrophosphate or acid bath. This copper layer provides conductivity to the exposed underlying copper circuitry. In step 360, photoresist is applied to the surface, exposed, developed to remove the unexposed resist, and etched with cupric chloride and hydrochloric acid. This step will remove unwanted copper and provide the desired corrective circuitry including copper vias, bonding pads, and additional wiring.

In step 370, the surface is curtain coated with a photosensitive dielectric layer that is preferably fully polymerizing such as Probimer 61. In step 380, the photosensitive layer is then exposed by a collimated light source to polymerize the exposed dielectric. In step 390, a developer, such as GBL described above, develops the unexposed dielectric away thereby exposing the underlying surfaces including vias and bonding pads. In step 400, the board is dried and thermally and/or UV cured by an oven. A corrosion inhibitor such as Entek is then placed on the surface by a sprayer in step 410.

The above described process results in a reworked printed circuit board without having to subtractive etch the original underlying copper layer. As a result, this process is reliable and can be utilized to cheaply and quickly rework faulty printed circuit boards.

One difficulty in utilizing the present invention is to maintain coplanarity of the printed circuit board surface. Coplanarity of the board is essential in most assembly processes where devices are soldered to the board. The addition of a couple of layers of a photosensitive dielectric tends to negatively impact this coplanarity. For example, bonding pads on the original surface are now below the level of the reworked surface after the photosensitive dielectric is removed from the bonding pads.

FIGS. 3A–3D illustrate how surface features such as bonding pads may be duplicated on the reworked surface and vias extended to the reworked surface to maintain surface coplanarity according to a preferred embodiment of the invention. An original printed circuit board 500 includes vias 510, 511 in bonding pads 520 and 521 for providing circuit access to the bonding pad on a buried layer of the printed circuit board. The original printed circuit board also includes vias 518 and 519 useful for several purposes including allowing pin-in-hole devices to be soldered into them. In addition, the original printed circuit board includes a bonding pad 525 with no via. Each of these features on the original surface may need to be duplicated or extended to the reworked surface to maintain surface coplanarity for assembly of devices to the printed circuit board.

When photosensitive dielectric 530 is coated on the surface, locations 540, 541, 545 and 549 of the photosensitive dielectric are not exposed so the dielectric in these locations is removed when it is developed. This provides access to each of the underlying features on the original board surface. Copper is then plated into the opening and on the surface of the exposed dielectric to provide a copper layer for new features on the rework surface. These new features include coplanar bonding pads 550 and 551 which may be directly above bonding pads 520 and 521 or may be extended or rotated around vias 540 and 541. Bonding pad 555 is also located above bonding pad 525 and it may be extended or rotated around via 545. Bonding pads 550, 551 and 555 also include dimples 560, 561 and 565 resulting from vias 540, 541 and 545. Also shown is a surface mount device 590, such as a resistor, soldered to the reworked surface after the rework process i s completed.

Figure 3A:
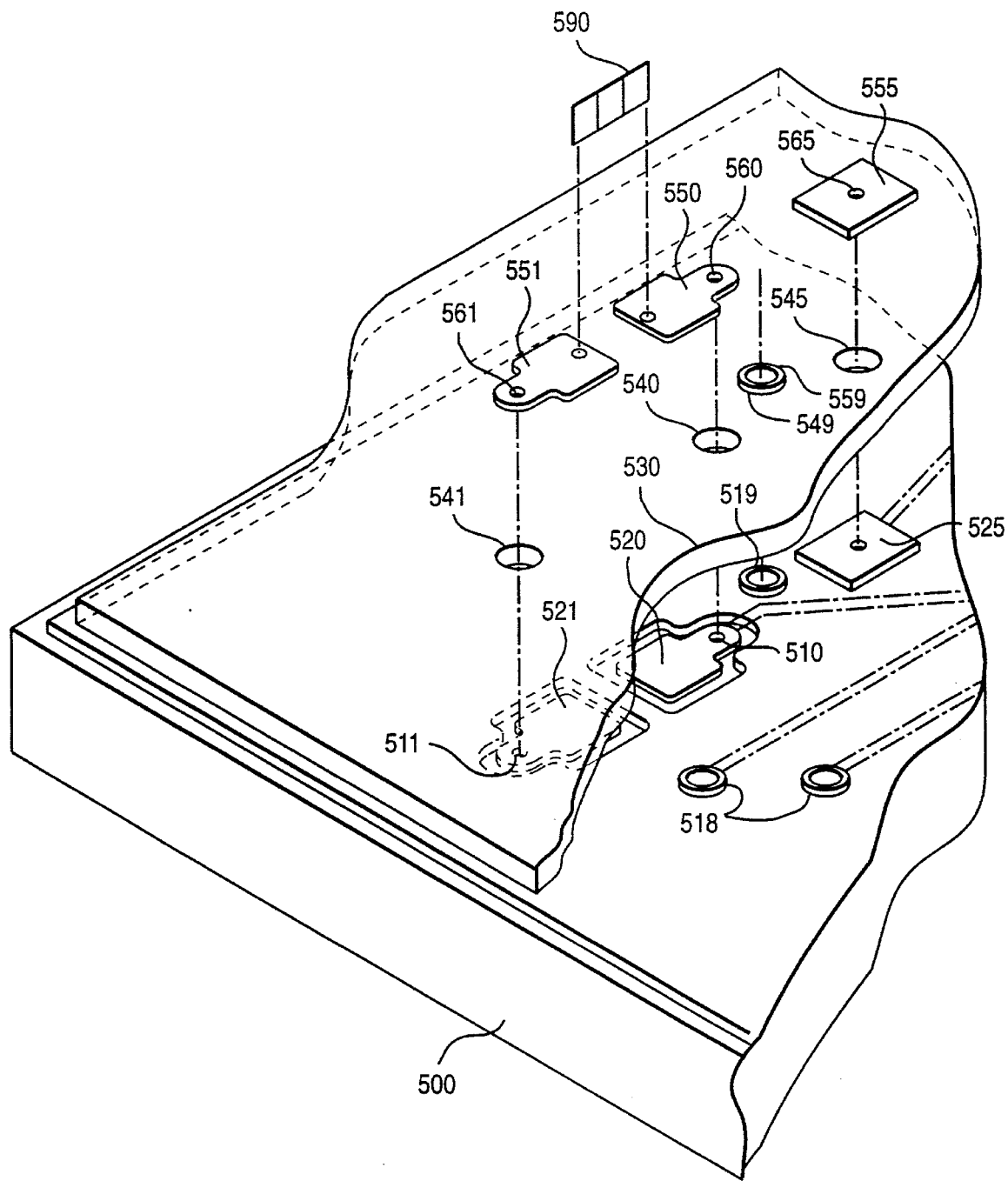
FIGS. 3A–3D illustrate how surface features such as bonding pads may be duplicated on the reworked surface to maintain surface coplanarity according to a preferred embodiment of the invention.
Figure 3B:
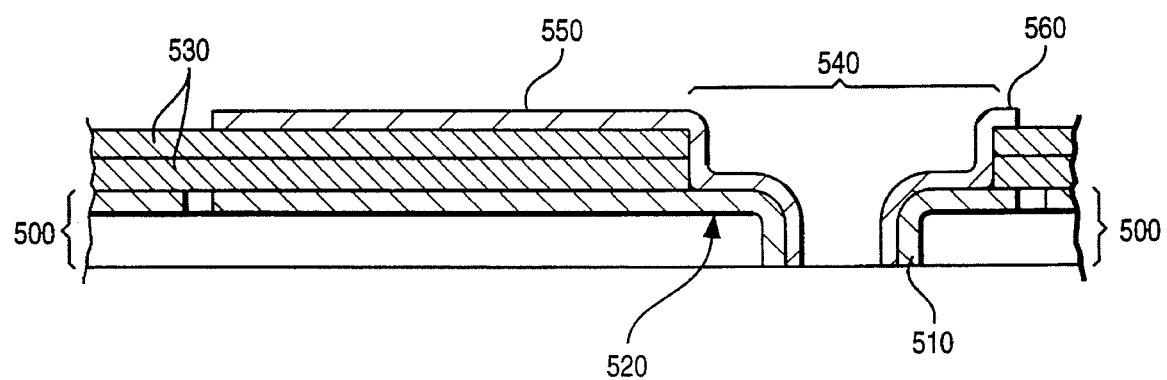
Figure 3C:
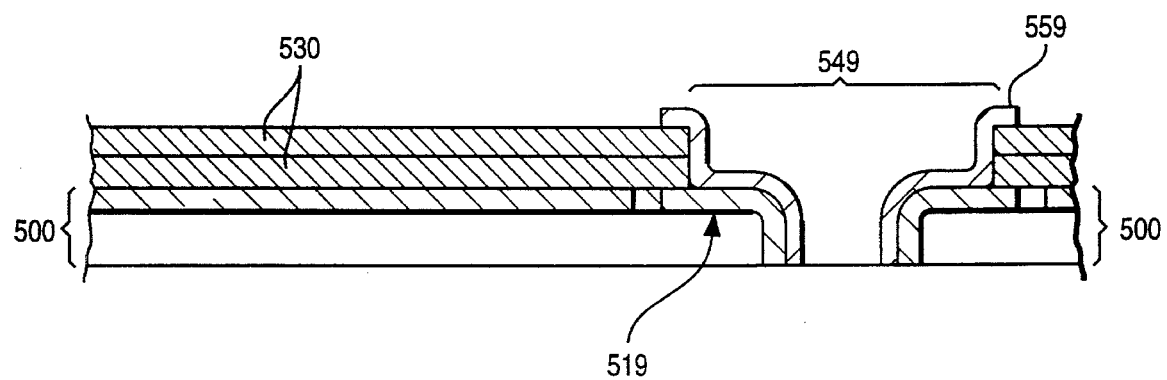
Figure 3D:
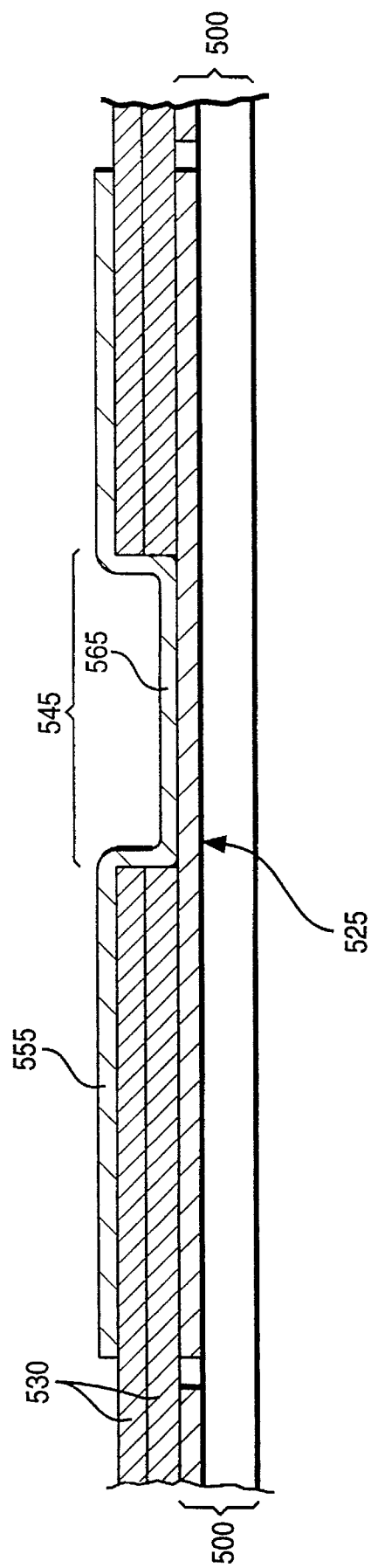

In the preferred embodiment, there are preferred geometries for improving the success rate of the rework process. These geometries are preferred for the above described embodiment of the invention using optical alignment. The geometries may vary with other alternative embodiments, as is apparent to one of ordinary skill in the art, such as the alignment technique used, the density of the circuitry being reworked, etc. FIG. 3C illustrates a via that may be used for pin-in-hole devices. In the preferred embodiment, the dielectric 530 should overlap the copper of original via by 3 mils (0.003 inches) but yet remain at least 3 mils from the via opening. This helps avoid developing the dielectric in the hole and also helps maintain coplanarity in the region. FIG. 3D illustrates a bonding pad for surface mount devices being duplicated on the new surface with a dimple in the middle of the new bonding pad. In the preferred embodiment, the dimple should be located in the middle of the pad and should not exceed 10 mils in diameter. This will provide adequate space for electrically coupling the new bonding pad to the bonding pad on the original surface while maintaining enough coplanarity for subsequent assembly processes.

Although the present invention has been fully described above with reference to specific embodiments, other alternative embodiments will be apparent to those of ordinary skill in the art. For example, a ground shield may be added to the underlying printed circuit board coupled to ground wires and covering most of the exterior surface except where new bonding pads and vias have been provided. Therefore, the above description should not be taken as limiting the scope of the present invention which is defined by the appended claims.

What is claimed is:

1. A method of reworking a printed circuit board having a surface including electrical circuitry comprising the steps of:

a) covering the surface with a dielectric, said dielectric insulating said electrical circuitry;

b) selectively removing portions of said dielectric to uncover selected areas of said electrical circuitry;

c) coating the surface with an electrically conductive material, said electrically conductive material being electrically connected to said selected areas; and d) selectively removing portions of said electrically conductive material providing an electrically conductive corrective circuitry on said dielectric.

2. The method of claim 1 wherein the step of coating includes coating an entire surface of at least one side of the printed circuit board with the electrically conductive material.

3. The method of claim 1 wherein said electrical circuitry includes at least two electrical conductive channels and said step of selectively removing portions of said dielectric includes the step of selectively removing portions of said dielectric to uncover selected areas from said two electrical conductive channels, each of said two electrical conductive channels having a selected area.

4. The method of claim 1 wherein said electrical circuitry includes at least one electrical conductive channel having an electric path interruption and said step of selectively removing portions of said dielectric includes the step of selectively removing portions of said dielectric to uncover two selected areas from said electrical conductive channel, each of said two selected areas being on opposite side of said electric path interruption.

5. The method of claim 4 wherein said step of covering includes coating the surface with a dielectric, exposing selected areas of the dielectric, and developing the dielectric.

6. The method of claim 5 wherein said step of coating the surface with a dielectric includes coating the surface with a fully polymerizing dielectric.

7. The method of claim 5 further comprising the step of cleaning the surface prior to covering the surface with a dielectric.

8. The method of claim 7 further comprising the step of roughening the surface after covering the surface and prior to selectively providing circuitry.

9. The method of claim 8 wherein said step of selectively providing circuitry includes providing vias through the dielectric to the surface of the printed circuit board.

10. The method of claim 9 wherein said step of providing circuitry includes providing bonding pads on the dielectric coupled to bonding pads on the surface of the printed circuit board.

11. The method of claim 10 wherein said step of providing bonding pads includes providing vias in said bonding pads on the dielectric less than or equal to 10 mils in diameter to said bonding pads on said printed circuit board surface.

12. The method of claim 11 further comprising the step of assembling devices to said corrective circuitry.

13. A printed circuit board having a surface including electrical circuitry comprising:

a) a dielectric deposited on the surface to insulate said electrical circuitry, said dielectric having portions selectively removed to uncover selected areas of said electrical circuitry; and b) a layer of electrically conductive material deposited on said surface, said layer of electrically conductive material being electrically connected to said selected areas and having portions selectively removed to provide a conductive corrective circuitry on said dielectric.

14. The printed circuit board of claim 13 wherein said corrective circuitry circuitry includes vias through the dielectric to the surface of the printed circuit board.

15. The printed circuit board of claim 13 wherein said corrective circuitry includes bonding pads on the dielectric coupled to bonding pads on the surface of the printed circuit board.

16. The printed circuit board of claim 15 further comprising devices coupled to said corrective circuitry.

17. A data processing system comprising:
a) processor for processing data;
b) a memory for storing data to be processed;
c) a printed circuit board coupled to said processor having a surface including electrical circuitry, said printed circuit board including:
  i) a dielectric deposited on the surface to insulate said electrical circuitry, said dielectric having portions selectively removed to uncover selected areas of said electrical circuitry; and
  ii) a layer of electrically conductive material deposited on said surface, said layer of electrically conductive material being electrically connected to said selected areas and having portions selectively removed to provide a conductive corrective circuitry on said dielectric.

18. The data processing system of claim 17 wherein said corrective circuitry circuitry includes vias through the dielectric to the surface of the printed circuit board.

19. The data processing system of claim 18 wherein said corrective circuitry includes bonding pads on the dielectric coupled to bonding pads on the surface of the printed circuit board.

20. The data processing system of claim 19 further comprising devices coupled to said corrective circuitry.

* * * * *